United States Patent [19]

Cooper

[11] Patent Number: 5,671,231

[45] Date of Patent: *Sep. 23, 1997

[54] METHOD AND APPARATUS FOR PERFORMING CACHE SNOOP TESTING ON A CACHE SYSTEM

[75] Inventor: Steve Cooper, Cedar Park, Tex.

[73] Assignee: Dell USA, L.P., Austin, Tex.

[*] Notice: The term of this patent shall not extend beyond the expiration date of Pat. No. 5,524,208.

[21] Appl. No.: 271,616

[22] Filed: Jul. 7, 1994

[51] Int. Cl.$^6$ .......................... G01R 31/28; G06F 11/00; G06F 9/26

[52] U.S. Cl. .................. 371/22.1; 395/183.01; 395/473

[58] Field of Search .................. 395/473, 471, 395/468, 445, 450, 460, 462, 183.01, 180, 183.05, 183.18; 371/22.1, 21.1; 364/238.4, 262.9, 243.4, 243.41, 244.6, 246.6, 246.9, 964.2

[56] References Cited

U.S. PATENT DOCUMENTS

| | | |
|---|---|---|
| 5,119,485 | 1/1992 | Ledbetter, Jr. et al. ............ 395/425 |
| 5,130,922 | 1/1992 | Liu .......................................... 395/425 |
| 5,359,723 | 10/1994 | Mathews et al. ..................... 395/425 |
| 5,426,765 | 6/1995 | Stevens et al. ...................... 395/425 |
| 5,524,208 | 6/1996 | Finch et al. ...................... 395/183.01 |
| 5,555,398 | 9/1996 | Raman .................................. 395/470 |
| 5,557,769 | 9/1996 | Biley et al. ........................... 395/473 |

*Primary Examiner*—Robert W. Beausoliel, Jr.
*Assistant Examiner*—Trinh L. Tu
*Attorney, Agent, or Firm*—Haynes and Boone, L.L.P.

[57] ABSTRACT

A system and method for testing the snoop capabilities of a read-only code cache system. A test code sequence for testing the snooping operations of the read-only code cache is first loaded into system memory, and an identical copy of the test code sequence is loaded into the read-only code cache system at the same address. A direct memory access (DMA) transfer is then initiated to transfer one or more instructions to overwrite a portion of the system memory where the test code sequence is located. If the snooping functions of the read-only code cache are operating properly, the code cache will detect the cycles and invalidate the respective lines in the code cache where the instructions are located. Upon completion of the direct memory access transfer, the CPU performs the remainder of the test code sequence and determines whether the snooping operations performed properly.

21 Claims, 2 Drawing Sheets

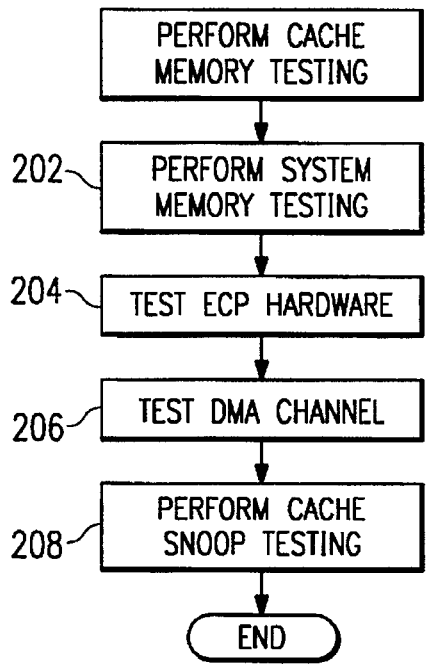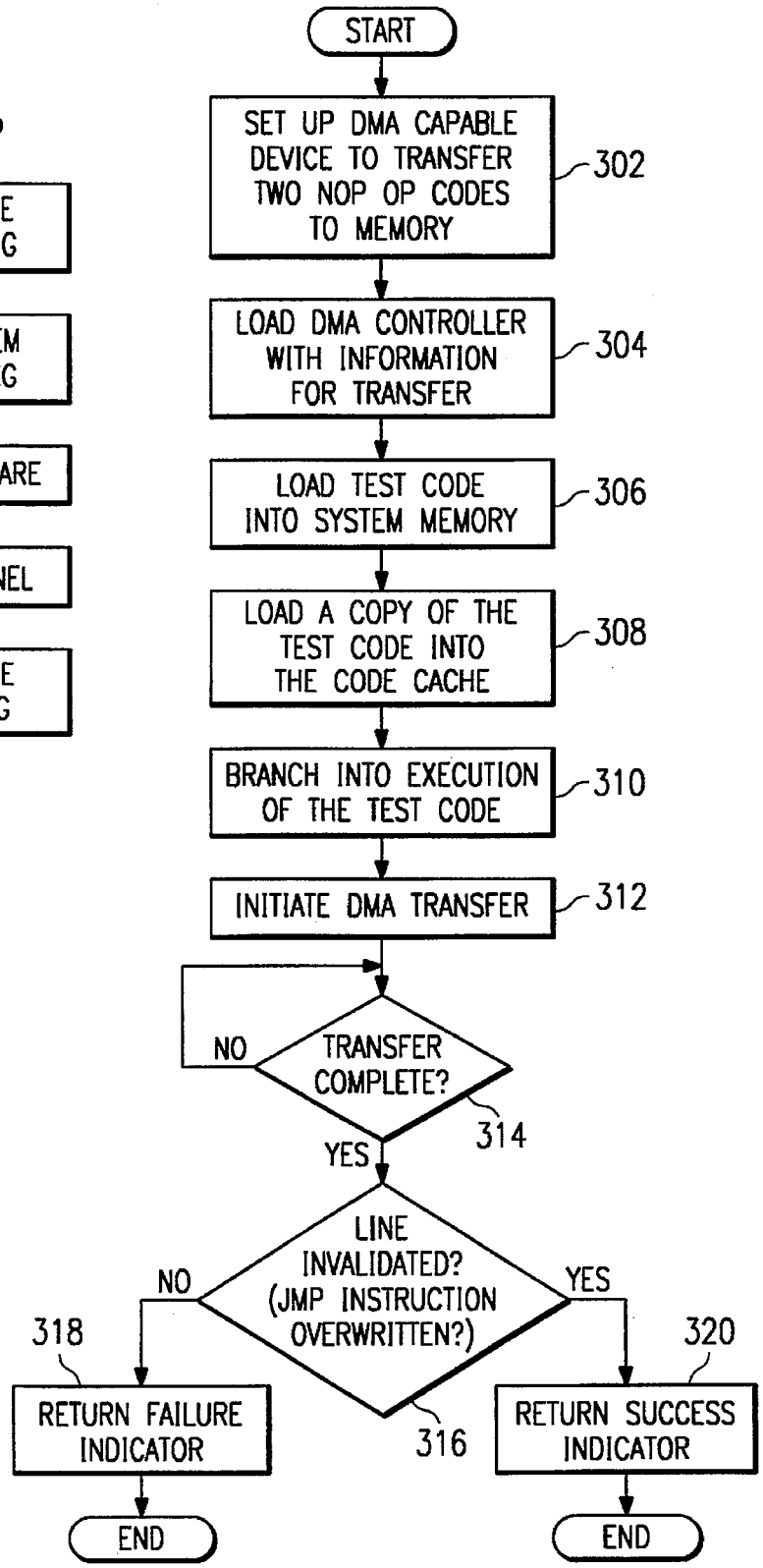

METHOD AND APPARATUS FOR PERFORMING CACHE SNOOP TESTING ON A CACHE SYSTEM

FIELD OF THE INVENTION

The present invention relates to the testing of cache memory systems in computer systems, and more particularly to a method and apparatus for testing the snooping operations of a read-only code cache system.

Description of the Related Art

Modern computer systems are required to manipulate and store increasingly larger amounts of code and data. In addition, there is an increasing need to access data as fast as possible. Dynamic Random Access Memory (DRAM) is typically used to store the bulk of data in a computer system because it is relatively low cost. However, DRAM is slow with respect to a computer's microprocessor. Static Random Access Memory (SRAM) is fast with respect to a computer's microprocessor. However, SRAM is relatively expensive. Therefore, to obtain a compromise between speed and cost, most computer systems utilize a large amount of DRAM as system memory, and a small amount of fast SRAM as cache. A cache memory is a small amount of very fast, and expensive, zero wait state memory that is interposed between a device which regularly requests data and a storage device. For example, the most common type of cache memory is referred to as a microprocessor cache memory. The microprocessor cache memory is interposed between the microprocessor and system memory and stores frequently used code and data. When a microprocessor requests data and the data resides in the cache, then a cache hit occurs and the data is provided back to the microprocessor without requiring a system memory access. If the requested data does not reside in the cache, then a cache miss occurs, and the microprocessor must retrieve the requested data from system memory.

Cache management is usually performed by a device referred to as a cache controller. The cache controller determines the organization of the cache memory as well as the write policy that is enforced. For example, a cache memory may be organized as either a direct mapped cache or a set associative cache. In order to more fully understand cache organization, it is helpful to conceptualize system memory as comprising a plurality of pages of memory of a certain size. A number of the upper address bits comprising a memory address can individually access each of these conceptual pages, while the remaining or lower address bits comprise an offset within a respective page.

In a direct mapped cache, the cache memory is organized as a single conceptual page of memory, and there is a single unique location in the cache memory where a piece of data may reside. This unique location is determined by the offset or lower address bits of the address of the respective data. The upper address bits, referred to as the tag, are stored in a separate block of memory referred to as the tag memory. Each location in the cache memory includes a corresponding tag location which stores the upper address bits of the address corresponding to the data stored in the respective cache memory location.

In a set associative cache design, the cache memory is organized into multiple banks or ways of cache memory. Thus, in a four-way set associative cache, data having a given address can be stored in either of four places in the cache memory. As with a direct mapped cache, where the data is stored in a respective bank of memory depends on the offset or lower address bits of the address corresponding to the data, and the upper address bits or tag are stored in a corresponding tag location.

In both a direct-mapped and a set associative cache, when a memory access occurs the cache controller performs a tag compare cycle to compare the tag location corresponding to the respective offset where the data might be stored with the upper address bits of the requested address. If the contents of the tag location equal the upper address bits of the memory access, then a cache hit occurs, and the data is provided from the cache directly to the CPU. If a cache miss occurs, the requested data is retrieved from the system memory.

The write policies enforced by a cache controller are generally referred to as either write-through or write-back. In a write-through cache, when a write hit occurs the data is updated in both the cache memory and in system memory simultaneously. In a write-back cache, the data is immediately updated in the cache, but is written back to system memory only when the need arises, such as when another device requests this data from system memory.

A microprocessor architecture may comprise only one cache system or may comprise multiple levels of cache systems. For example, many cache architectures include a first level on-chip cache, referred to as an L1 cache, and a second level external cache, referred to as an L2 cache. Other cache architectures include only an L1 cache or only an L2 cache. In a computer system that includes both an L1 and an L2 cache, a data request is forwarded first to the L1 cache system. If the requested data resides in the L1 cache, the L1 cache provides the requested data to the CPU. If the requested data does not reside in the L1 cache, the request is forwarded to the L2 cache. If the requested data resides in the L2 cache, the L2 cache provides the requested data to the CPU, and the data is also typically stored in the L1 cache. If the requested data does not reside in the L2 cache, the request is forwarded to system memory.

In addition, many microprocessor cache systems include separate code and data caches wherein the code cache stores CPU instructions and the data cache stores data. In many cache designs the code cache is implemented as a read-only cache. A read-only cache cannot be written into, i.e., a CPU or bus master cannot simply write code and data into the cache. Also the CPU cannot directly read the contents of a read-only cache as data. A read-only code cache is loaded when the CPU reads one or more instructions from system memory. In addition, since the contents of a read-only code cache cannot be directly modified, a read-only code cache has no need to write data back to system memory.

A cache system is generally required to monitor (or snoop) the computer system bus on which it is located to determine if another bus master is accessing system memory. This is necessary to prevent inconsistencies from occurring between the data stored in system memory and the data stored in the cache memory. The operation of a cache system in monitoring system memory accesses by other bus masters is referred to as bus watching or snooping. Cache systems are required to snoop the bus to ensure that a bus master does not modify data in the system memory that is also stored in the cache memory. Examples of bus masters which can access system memory independently of the CPU include other processors, a DMA (direct memory access) controller, or expansion cards situated on the expansion bus with bus mastering capability. Ira bus master were to update data in the system memory, and a copy of this data also resided in the cache memory, then the cache memory would contain invalid or stale data.

A write-through cache snoops writes by other bus masters and detects whether a bus controller is updating data in system memory that is also stored in the cache memory. This involves latching the address on the bus and performing a tag compare cycle, to determine if the memory location being written to also resides in the cache. If a snoop hit occurs, the cache memory either updates the respective line in the cache memory where this copy of data is located, or more typically, the cache memory invalidates the respective line where this data is stored. In a write-back cache design, the cache memory often contains updated or new data that has not yet been updated in the system memory. In other words, a write-back cache memory often includes updated data in a respective location, and the corresponding location in system memory contains invalid or stale data. Therefore, when other bus masters access the system memory, a write-back cache is required to monitor or snoop all bus master accesses, i.e., all bus master write and read cycles to and from the system memory, and if a "hit" occurs, the cache controller writes back modified data that is stored in cache memory to the system memory.

A read-only cache system is required to snoop write cycles to ensure that a bus master does not modify data in the system memory that is also stored in the cache memory. For example, when the CPU reads one or more instructions from system memory, this read loads the instructions into the read-only code cache system. If another bus master later writes new data to this address space, then the code cache and system memory will be inconsistent. If the CPU later reads this address space, the CPU would obtain the incorrect version of data stored in the code cache, not the correct updated data stored in system memory. Therefore, a read-only code cache snoops write cycles by other bus masters and invalidates lines in the cache that are updated with new data in the system memory.

As part of cache memory testing, it is also desirable to perform cache snoop testing on the cache to ensure that the cache system performs snooping operations properly. As mentioned above, a cache system only snoops bus cycles when another bus master generates system memory accesses. This other bus master could be another microprocessor in a multiprocessor computer system, an intelligent bus master situated on the expansion bus such as an EISA bus master, or the DMA controller initiating DMA cycles to the system memory. Cache snoop testing for read/write data caches is typically performed by initiating bus master cycles and determining whether the cache snooping operations were performed properly. The principal method has been to load the cache memory with data from a specified address space and then write new data corresponding to this address space to the system memory. If the cache snooping function is operating properly, the cache system will invalidate the respective lines in the cache corresponding to this address space. The CPU can then read this address space and determine if the cache lines were properly invalidated.

However, existing methods for testing the snoop capabilities of read/write data caches cannot be used to test the snooping operations of a read-only code cache. As discussed above, data cannot be written into a read-only code cache, but rather a read-only code cache is loaded when the CPU reads instructions from the system memory. In addition, unlike a data cache, the contents of a read-only code cache cannot be read by the CPU as data, but rather a read-only code cache only provides instructions to the CPU for execution. Thus, the usual method of testing snoop cycles in cache systems, i.e., writing a unique pattern into the read/write cache, generating a system memory access to force a snoop cycle, and then verifying that the data pattern in the cache was either correctly written back to system memory or invalidated, cannot be used for read-only code caches. Therefore, a method and apparatus is greatly desired which allows reliable cache snoop testing of read-only code cache systems.

SUMMARY OF THE INVENTION

The present invention comprises a system and method for testing the snoop capabilities of a read-only cache system. In the preferred embodiment, the present invention is used to test the snooping functions of a read-only code cache system.

According to the present invention, a test code sequence for testing the snooping operations of the read-only code cache is first loaded into system memory. In the preferred embodiment, the test code sequence includes a jump ("jmp) instruction which branches to a portion of the code that returns a failure indicator. The test code sequence also preferably includes a portion that returns a success indicator if the jmp instruction is not executed. An identical copy of the test code sequence is then loaded into the read-only code cache system at the same address.

A direct memory access (DMA) transfer is then initiated to transfer one or more no-operation op (NOP) codes to the portion of the system memory where the jmp instruction is located. In the preferred embodiment, the DMA transfer is initiated using a first-in, first-out (FIFO) buffer in an ECP (extended capabilities port) parallel port. If the snooping functions of the read-only code cache are operating properly, the code cache will detect the cycles and invalidate the respective lines in the code cache where the jmp instruction is located.

Upon completion of the DMA transfer, the CPU performs the remainder of the test code sequence and determines whether the snooping operations were performed properly. If the CPU encounters the jmp instruction, then the snooping operation did not properly invalidate this line, and thus a failure indicator is returned. However, if the cache snooping operation performed properly, the line in the code cache storing the jmp instruction will have been invalidated during the snooping operation, and thus the CPU will be forced to obtain instructions corresponding to this line from system memory. The CPU will thus obtain the no-operation instructions transferred during the DMA transfer and will not execute the jmp instruction. Thus, a success indicator will be returned to the CPU.

Therefore, the system and method of the present invention allows a simple and reliable mechanism for testing the snooping operations of a read-only code cache system. The present invention provides a testing method for read-only cache systems which has heretofore been unavailable in the art.

BRIEF DESCRIPTION OF THE DRAWINGS

A better understanding of the present invention can be obtained when the following detailed description of the preferred embodiment is considered in conjunction with the following drawings, in which:

FIG. 2 is a flowchart diagram illustrating a testing sequence for the computer system of FIG. 1 according to one embodiment; and FIG. 3 is a flowchart diagram illustrating a cache snoop testing method performed for the read-only code cache system of FIG. 1 according to the preferred embodiment of the invention.

DETAILED DESCRIPTION OF THE PREFERRED EMBODIMENT

Figure 1:
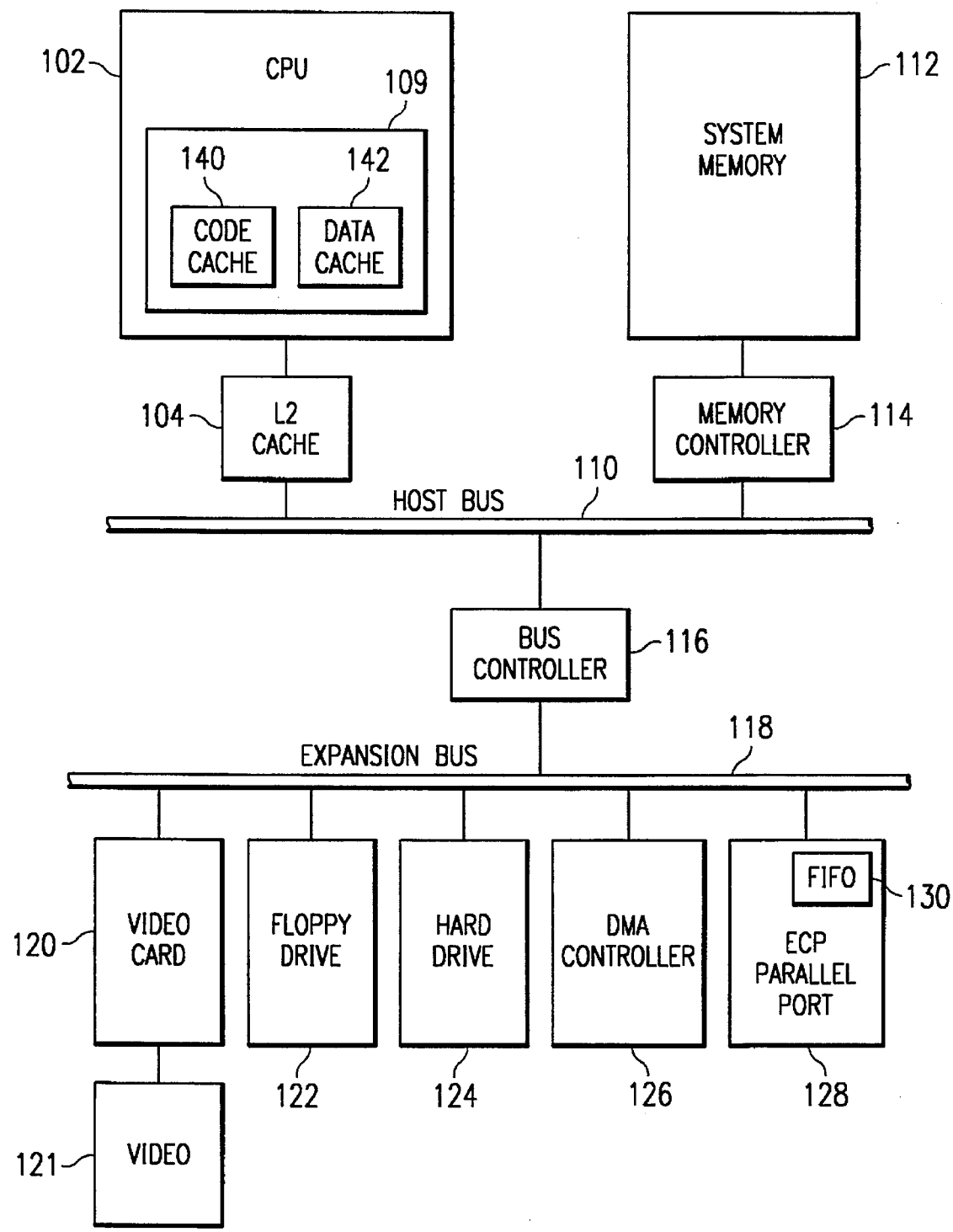
FIG. 1 is a block diagram of a computer system which performs cache snoop testing according to the present invention.

Referring now to FIG. 1, a block diagram illustrating a computer system which performs cache snoop testing on read-only cache systems according to the present invention is shown. The elements of a computer system not necessary to understand the operation of the present invention have been omitted for simplicity. It is also noted that the present invention may be used in other computer architectures, as desired.

The computer system includes a central processing unit or CPU 102 which is coupled to a memory or host bus 110. In the preferred embodiment the CPU 102 is an Intel Pentium microprocessor, although it is noted that other processors may be used. The computer system preferably includes an on-chip first level or L1 cache system 109 that includes a code cache 140 and a data cache 142. The code cache 140 is a read-only code cache. As discussed in the background section, data cannot be written into a read-only code cache system, and further the contents of a read-only code cache cannot be read by the CPU as data. The computer system may also include a second level cache subsystem 104 coupled between the CPU 102 and host bus 110. The host bus 110 includes address, data and control portions. System memory or main memory 112 is coupled to the host bus 110 by means of memory controller 114. The host bus 110 is coupled to an expansion or input/output (I/O) bus 118 by means of a bus controller 116. The expansion bus 118 includes slots for various other devices, preferably including a video card 120 for connecting to a video monitor 121, a floppy drive 122 and hard drive 124. A DMA (direct memory access) controller 126 is also coupled to the expansion bus 118. The DMA controller 126 operates to transfer data between peripheral devices on the expansion bus 118 and the main memory 112.

A parallel port 128 based on the Extended Capabilities Parallel Port (ECP) standard is also preferably coupled to the expansion bus 118. The ECP is a parallel port standard jointly developed by Microsoft and Hewlett Packard and is now WEE Standard 1284. The ECP standard parallel port includes a 16 byte first-in first-out (FIFO) buffer 130. The ECP parallel port 128 includes a test mode wherein software can manually read and write to the FIFO buffer 130, and also includes an operating mode whereby the FIFO buffer 130 is filled or emptied by DMA cycles. If the parallel port 128 is in operating mode and the FIFO buffer 130 contains data, the CPU 102 can direct the FIFO buffer 130 to empty its contents. This causes the DMA controller 126 to initiate DMA transfer cycles to transfer the data from the FIFO buffer 130 to system memory 112. As discussed further below, the ECP parallel port 128 is used in the preferred embodiment to implement the cache snoop testing of the present invention. However, it is noted that other methods for initiating DMA cycles to perform cache snoop testing may be used as desired. In the present disclosure, the ECP parallel port 128 is also referred to as the extended capabilities parallel port. In the preferred embodiment, the ECP parallel port 128 is provided in the PC87332VF chip produced by National Semiconductor. For more information on the ECP parallel port 128, please see the "Extended Capabilities Port: Specification Kit" Revision 1.03, published Feb. 10, 1993, available from Microsoft Corp., which is hereby incorporated by reference. Please also see the IEEE Standard 1284 specification, which is hereby incorporated by reference. For more information on using the ECP parallel port in cache snoop testing of a read/write data cache, please see related copending application Ser. No. 08/257,404, titled "Method and Apparatus for Performing Cache Snoop Testing in a Computer System" and filed Jun. 9, 1994, which is hereby incorporated by reference.

In the preferred embodiment, cache snoop testing is performed after certain other subsystems have been tested to ensure that the system can differentiate between cache snoop failures and other subsystem failures. Referring now to FIG. 2, a flowchart diagram illustrating various testing procedures performed on the computer system of FIG. 1 is shown. In step 202 the computer system performs a test of system or main memory 112. As is well known in the art, this comprises writing various patterns to the system memory 112 and then reading these patterns back to determine if the system memory 112 is operating properly. In step 204 the computer system tests the ECP parallel port hardware to ensure that the ECP registers and the FIFO buffer 130 are both readable and writable. In step 206 the computer system tests the operation of the DMA channel. It is noted that the above testing can be performed in a different order, for example, the ECP hardware can be tested prior to testing the system memory 112, etc. In step 208 the computer system diagnostics perform cache snoop testing according to the present invention.

The cache snoop testing performed in step 208 preferably comprises testing the snooping operations of the second level cache 104, the first level data cache 142, and the first level code cache 140. Conventional methods may be used for testing the snooping operations of the second level cache 104 and the first level data cache 142. In the preferred embodiment, the cache snoop testing method for these caches uses the ECP parallel port 128 to generate DMA cycles. For more information on this method please see U.S. application Ser. No. 08/257,404 referenced previously and incorporated herein by reference. Cache snoop testing for the code cache 140 uses a novel method according to the present invention, as discussed below.

Referring now to FIG. 3, a flowchart diagram illustrating operation of the preferred embodiment of the present invention is shown. It is noted that the flowchart in FIG. 3 illustrates only the preferred embodiment, and it is noted that other embodiments may be used incorporating the principles and methods of the present invention. The method in FIG. 3 is preferably performed with the second level cache 104 disabled so that errors can be localized to the code cache 140. The method may also be performed with the second level cache 104 enabled after successfully testing the snooping operations of the code cache 140.

The method of the preferred embodiment uses the DMA controller 126 to perform DMA transfers in order to test the snooping operations of the code cache 140. However, it is noted that other types of transfers initiated by other bus masters can be used, such as transfers by other processors, and transfers by logic with bus mastering capability. In the present disclosure, the above types of transfers which are performed other than by the CPU 102 and which can be used to perform cache snoop testing are referred to as bus master transfers. In the preferred embodiment of the invention, the cache snoop testing utilizes the sixteen byte FIFO buffer 130 in the ECP parallel port 128 to generate DMA transfers. This allows cache snoop testing to be performed reliably in software without requiring use of the disk drive subsystem to initiate the necessary DMA cycles to perform cache snoop testing.

In step 302 the CPU 102 sets up a DMA capable device to transfer two NOP (No-OPeration) opcodes to designated addresses in system memory 112. In the preferred embodiment, this involves loading the ECP FIFO buffer 130 with the two NOP instructions. It is noted that loading the ECP FIFO buffer 130 does not operate to load the code cache 140 with these instructions. In step 304, the CPU loads the DMA controller 126 with information regarding the transfer of the two NOP opcodes to system memory 112. This information includes the physical address where the two NOP opcodes are to be transferred, referred to as jump_mark as described below, a byte count of two for the two NOP op codes being transferred, as well as other information, including an address increment, write transfer, etc. In step 306 the CPU 102 loads a test code sequence according to the preferred embodiment of the invention into an address space of system memory 112. It is noted that steps 302–308 can be performed in any order, as desired.

In step 308 the CPU 102 loads a copy of the test code sequence into the code cache 140. In the preferred embodiment, the CPU 102 loads a copy of the test code sequence into the code cache 140 using the test registers of the Pentium processor. In an alternate embodiment, the CPU 102 performs a code fetch to load the test code sequence into the code cache 140. In this embodiment, it is necessary that the test code be aligned on a cache line boundary to ensure that the entire test code sequence is loaded into the code cache 140 during the code fetch. Other methods may be used to load the code cache 140, as desired. It is noted that the test code is loaded into the code cache 140 at the same address as the version of the test code stored in system memory 112. It is also noted that the copy of the test code stored in the code cache 140 is marked valid at this time.

In step 310, the CPU branches into execution of the test code. The test code used in the preferred embodiment of the invention is listed below with accompanying comments:

```
         call start_dma    ;Start DMA transfer and wait for terminal count.
jump_mark:                  ;Target of DMA transfer.
         jmp dcm_fail       ;If this instruction didn't get overwritten by NOP's, fail.
         clc                ;If we get here, the original cache line was invalidated
                            ;and the modified code, with NOP'S, was fetched from
                            ;memory. Return success indicator.
         jmp dcm_exit
dcm_fail:
         stc                ;Return failure indicator
dcm_exit:
         ret
```

It is noted that when the CPU 102 branches into execution of the test code in step 310, the CPU 102 will be executing out of the code cache 140 at this point. The remaining steps in the flowchart illustrated in FIG. 3 involve execution of the test code sequence listed above.

In step 312 the CPU 102 initiates the DMA transfer and waits for the terminal count indicating that the transfer has completed. The DMA transfer is preferably initiated through the ECP parallel port 128, as discussed above. The DMA transfer comprises the DMA controller 126 transferring the two NOP op codes to the respective addresses in the system memory 112. As mentioned above, the two NOP opcodes are transferred to "jump_mark", which causes the two NOP opcodes to overwrite the jmp instruction and the dcm_fail value in the test code sequence stored in system memory 112. If the snooping function of the code cache 140 is operating properly, the code cache 140 latch these addresses, perform a tag compare cycle, and determine that data corresponding to these addresses also reside in the code cache 140. In other words, if the snooping function of the code cache 140 is operating properly, a snoop hit will occur in the code cache 140. In response to the snoop hit, the code cache 140 invalidates the respective lines in the code cache 140 corresponding to these addresses. In the test code according to the preferred embodiment of the invention, the cache line storing the jmp instruction and the dcm-fail value in the test code is invalidated in the code cache 140. Thus, after this invalidation, the only version of data corresponding to these two addresses will be the two NOP operations transferred by the DMA controller 126 to the system memory 112.

When the transfer has completed in step 314, then in steps 316–320 the CPU 102 executes the remainder of the test code sequence and returns either a success or failure indicator. In the preferred embodiment, the test code sequence uses the carry flag as the success/failure indicator. In other words, the CPU 102 uses the returned carry flag value to determine if the respective two lines in the code cache were properly invalidated by snoop cycles. The carry flag is cleared to indicate success and is set to indicate failure. It is noted that other flags or other methods may be used to indicate success or failure as desired.

In step 316 the CPU 102 determines if the respective code line was properly invalidated by snoop cycles. If the line was not properly invalidated, then the jmp instruction remains in the code cache 140. Thus, when the CPU 102 resumes execution of the test code, the jmp instruction will cause the CPU 102 to jump to the stc (set carry) flag instruction, which is used to return a failure indicator in step 318. Operation then completes. If the snooping operation was properly performed during the DMA transfer in step 312, then the jmp instruction in the code cache 140 will have been invalidated during the DMA transfer in step 312. Thus, when the CPU 102 resumes execution of the test code, the CPU 102 will obtain the two NOP instructions from the system memory 112 because the corresponding lines in the code cache 140 was invalidated. Thus, the CPU 102 will not execute the jmp instruction, and the clc (clear carry) flag instruction will be executed, thereby returning a success indicator in step 320.

Therefore, a system and method for performing snoop testing operations on read-only code caches is shown and described. Thus, snoop testing of read-only code caches, which has not been possible in the prior art, can now be performed. Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A method of performing cache snoop testing on a cache system in a computer system comprising a CPU, system memory coupled to the CPU, and a cache system coupled between the CPU and the system memory, wherein the cache system includes snooping logic for snooping bus master transfers to system memory, the method comprising the steps of:

loading a test code sequence into a first address space of the system memory;

loading a copy of the test code sequence into one or more lines of the cache system;

initiating a bus master transfer of one or more values to at least a portion of said first address space in the system memory;

determining if snooping operations in the cache system occurred properly during said bus master transfer by executing a portion of the test code sequence copy stored in said cache system.

2. The method of claim 1, further comprising the step of:

transferring said one or more values to said at least a portion of said first address space in the system memory after said step of initiating.

3. The method of claim 2, wherein said step of determining comprises determining if one or more lines of said one or more lines in the cache system where the test code sequence is stored was invalidated during said step of transferring.

4. The method of claim 1, wherein said cache system comprises a code cache system storing CPU instructions.

5. The method of claim 4, wherein said step of initiating the bus master transfer comprises executing a portion of said test code sequence in said cache system.

6. The method of claim 5, further comprising the step of:

transferring said one or more values to said at least a portion of said first address space in the system memory after said step of initiating;

wherein said test code sequence includes a jump instruction that branches to code which returns a failure indicator;

wherein said step of transferring comprises transferring one or more no-operation instructions to addresses in the system memory to overwrite said jump instruction in said system memory; and wherein if said jump instruction is not executed in said test code sequence, said test code sequence returns a success indicator.

7. The method of claim 6, wherein said step of initiating a bus master transfer comprises initiating a direct memory access transfer.

8. The method of claim 7, wherein the computer system further includes a buffer which transfers data to the system memory and a direct memory access controller which coordinates transfers between the buffer and the system memory, the method further comprising the steps of:

setting up the buffer to transfer said one or more instructions to the system memory; and loading the direct memory access controller with information regarding the transfer.

9. The method of claim 1, further comprising the steps of:

returning a success indicator after said step of determining if said snooping operations performed properly.

10. The method of claim 1, further comprising the step of:

returning a failure indicator after said step of determining if said snooping operations did not perform properly.

11. A computer system which performs cache snoop testing on a read-only cache system, comprising:

a CPU;

system memory coupled to the CPU, the system memory having a test code sequence stored in a first address space thereof;

a read-only cache system coupled to the CPU and the system memory, the read-only cache system having said test code sequence stored therein and including snooping logic for snooping bus master accesses; and a bus master which transfers one or more values to a portion of said first address space in the system memory to overwrite a portion of said test code sequence in the system memory;

wherein if the snooping logic in said read-only cache system is operating properly, the snooping logic snoops said bus master transfer and invalidates one or more lines in the read-only cache system; and wherein the CPU includes means for executing said test code sequence stored in the read-only cache system, wherein said means for executing determines if the snooping logic performed properly by executing said test code sequence stored in said read-only cache system.

12. The computer system of claim 11, wherein said means for executing determines if one or more lines in the read-only cache system where the test code sequence is stored was invalidated during said bus master transfer.

13. The computer system of claim 11, wherein said read-only cache system comprises a code cache system storing CPU instructions.

14. The computer system of claim 13, wherein said means for executing initiates the bus master transfer.

15. The computer system of claim 14, wherein said test code sequence includes a jump instruction that branches to code which returns a failure indicator, and wherein said bus master transfers one or more no-operation instructions to addresses in said first address space of the system memory to overwrite said jump instruction;

wherein if said means for executing does not execute said jump instruction in said test code sequence, said means for executing returns a success indicator.

16. The computer system of claim 15, wherein said bus master comprises a direct memory access controller.

17. The computer system of claim 16, wherein the computer system further includes a buffer which transfers data to the system memory, and wherein the direct memory access controller coordinates transfers between the buffer and the system memory, the CPU further comprising:

means for setting up the buffer to transfer said one or more instructions to the system memory; and means for loading the direct memory access controller with information regarding the transfer.

18. The computer system of claim 11, wherein said means for executing returns a success indicator if said means for executing determines that said snooping logic performed properly.

19. The computer system of claim 11, wherein said means for executing returns a failure indicator if said means for executing determines that said snooping logic did not perform properly.

20. A method for performing cache snoop testing on a computer comprising a CPU, a cache, and a system memory such that the cache is coupled between the CPU and the system memory, the method comprising: loading a test code sequence into the system memory and cache, making changes to a part of the test code sequence located in the system memory, and executing the test code sequence in the cache to determine if the cache snooped the changes in the system memory.

21. The method of claim 20, wherein the step of making changes to a part of the test code further comprises changing one or more instructions from jump instructions to no-operation instructions.

* * * * *

UNITED STATES PATENT AND TRADEMARK OFFICE
CERTIFICATE OF CORRECTION

PATENT NO. : 5,671,231

DATED : September 23, 1997

INVENTOR(S) : Steve Cooper

It is certified that error appears in the above-identified patent and that said Letters Patent is hereby corrected as shown below:

Column 2, line 64, "Ira" should be --If a--.

Column 4, line 18, "("jmp)" should be --("jmp")--.

Column 5, line 45, "WEE" should be --IEEE--.

Column 6, line 7, "fled" should be --filed--.

Column 6, line 65, "requiting" should be --requiring--.

Signed and Sealed this

Twenty-fourth Day of February, 1998

Attest:

BRUCE LEHMAN

*Attesting Officer*        *Commissioner of Patents and Trademarks*